United States Patent [19]

Barkus et al.

[11] Patent Number: 4,504,105
[45] Date of Patent: Mar. 12, 1985

[54] RELEASE MECHANISM FOR A CONNECTOR COVER

[75] Inventors: Lee A. Barkus, Millersburg; Edward J. Bright, Elizabethtown, both of Pa.

[73] Assignee: AMP Incorporated, Harrisburg, Pa.

[21] Appl. No.: 420,761

[22] Filed: Sep. 21, 1982

[51] Int. Cl.³ .......................................... H01R 13/506
[52] U.S. Cl. ........................... 339/75 MP; 339/17 CF
[58] Field of Search .......... 339/75 M, 75 MP, 17 CF, 339/91 R

[56] References Cited

U.S. PATENT DOCUMENTS

| 2,760,174 | 8/1956 | Burtt et al. | 339/91 R |
| 3,942,854 | 3/1976 | Klein et al. | 339/75 MP |
| 4,130,327 | 12/1978 | Spaulding | 339/17 CF |
| 4,189,201 | 2/1980 | Romania | 339/75 MP |
| 4,236,777 | 12/1980 | Merlina et al. | 339/17 CF |
| 4,241,966 | 12/1980 | Gomez | 339/75 M |
| 4,260,210 | 4/1981 | Babuka et al. | 339/75 M |
| 4,331,371 | 5/1982 | Ichimura et al. | 339/74 R |

FOREIGN PATENT DOCUMENTS

WO81/01773  6/1981  PCT Int'l Appl. .............. 339/91 R

Primary Examiner—John McQuade
Assistant Examiner—Thomas M. Kline
Attorney, Agent, or Firm—Allan B. Osborne

[57] ABSTRACT

The invention discloses a release mechanism for a connector cover of the type having latch members with lips thereon being caught by downwardly facing shoulders on the connector housing. The mechanism includes arms having side flaps which engage tabs on the latches to pivot the latches outwardly to withdraw the lips from beneath the shoulders.

4 Claims, 5 Drawing Figures

RELEASE MECHANISM FOR A CONNECTOR COVER

U.S. Pat. No. 4,130,327 describes a resilient cover consisting of a frame of four members defining a central opening. Two, parallel members are arcuate-shaped to provide resiliency. A first connecting member joining the arcuate members, carries two, spaced apart, forwardly projecting hinging portions. The opposite, second connecting member carries a depending flange having an inwardly directed U-shaped flange portion at its free end. A lever extending into the central opening from the second connecting member has an upwardly slanted portion and at the free end, a horizontal portion. The cover is mounted onto a substrate connector by inserting the hinging portions into slots on one side of the connector and catching the U-shaped flange portion under a downwardly facing shoulder on the opposite side of the connector. The cover is removed by depressing the horizontal portion on the lever. The second connecting member pivots on the top surface of the substrate positioned in the connector and in so pivoting, pulls the U-shaped flange portion out from under the downwardly facing shoulder.

The present invention is intended to provide releasing mechanism on a cover so that the cover may be removed from the connector without exerting any pressure on the substrate or on the connector itself.

The release mechanism of the present invention is attached to a cover having a pair of spaced-apart latches consisting of a depending section attached to an end of a horizontal section. A first tab extends laterally from the outer edge of the horizontal section and a second tab extends laterally from the outer edge of the depending section near the free end thereof which is turned inwardly to provide a lip which may be caught in under a downwardly facing shoulder on a connector housing. The release mechanism includes a plate from which an arm extends forwardly from each of the two corners of one end. The arms include a flap attached to and extending downwardly from the outer edge of a horizontal section. A first notch is provided in the rearwardly facing edge of the flap and is located near the horizontal section. A second notch is provided in the forwardly facing edge of the flap and is located near the lower end. The release mechanism is mounted on the cover by snaping the first tabs in the first notches and the second tabs in the second notches. Upon depressing the plate, the flaps are pivoted about the first tabs in a forwardly and upwardly direction. This pivoting motion pulls the depending section with it by means of the second tabs in the second notches and in so doing, pulls the lips out from under the downwardly facing shoulers on the housing to release the cover therefrom.

For a better understanding of the invention, reference will now be made by way of example to the accompanying drawings, in which.

Figure 1:
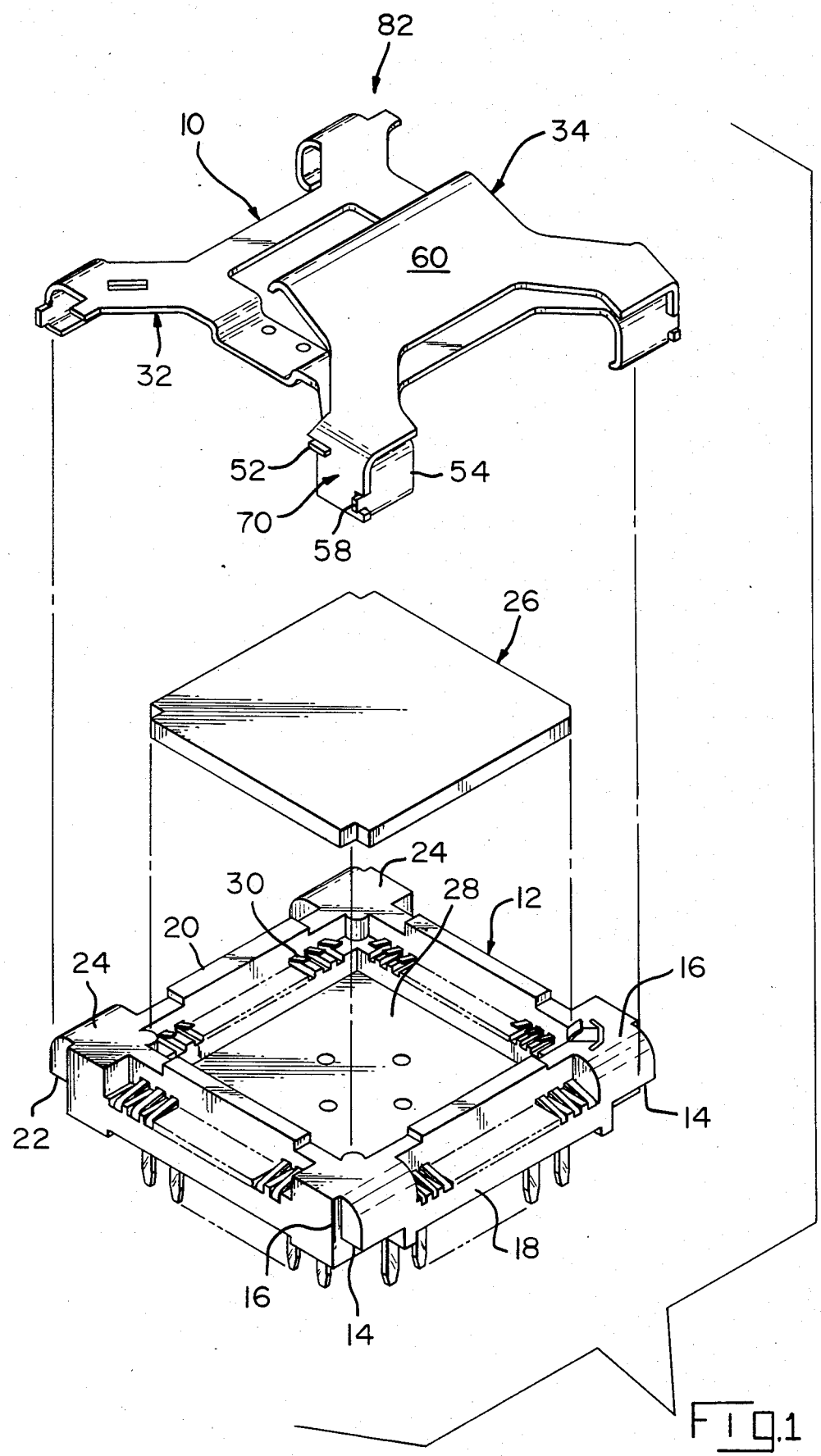
FIG. 1 is an exploded view showing the preferred embodiment of the release mechanism, constructed in accordance with the present invention, attached to a cover, the connector to which the cover may be latched and an active device substrate which may be positioned in the connector and retained therein by the cover.

Cover 10, shown in the several drawings, may be used with any connector having downwardly facing shoulders located at or near the two corners on one side and retaining means on the opposite side. One such connector is shown in FIGS. 1 and 3-5 and is indicated generally by reference numeral 12. This connector has downwardly facing shoulders 14 at the corners 16 of side 18. Retaining means are provided on the opposite side 20 which, in this case, are also downwardly facing shoulders 22 located at corners 24. Other retaining means would suffice provided appropriate modifications are made to cover 10. More about this later.

Connector 12 receives active device substrate 26, shown thereabove, in a central, upwardly opening compartment 28. Pads (not shown) on the substrate engage contact elements 30 in the connector. Besides retaining the substrate in the compartment, cover 10 presses the substrate against the elements to achieve a high electrical conductivity therebetween. Both the cover and connector are more fully described in U.S. Pat. No. 4,427,249.

FIG. 1 shows cover 10 with the release mechanism 34 of the present invention attached thereto. For a better understanding of the present invention, the cover will be described first in complete detail even though it is not part of this invention.

Figure 5:
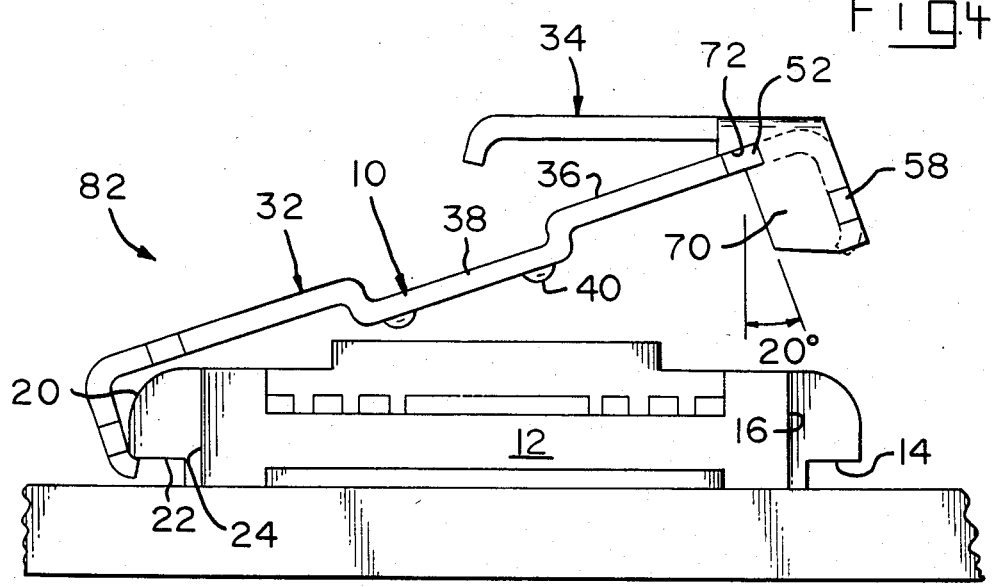

Cover 10 includes two, parallel and spaced apart pressure-providing side members 36. A downwardly displaced section 38 is positioned on side member. Dimples or bosses 40 project downwardly from the underside of these displaced sections to provide concentrated pressure points against a substrate. FIG. 5 shows these bosses clearly.

Two, parallel and spaced apart cross members 42 connect side members 36 to define a frame having a central opening 44. Substantially identical latch members 46 extend outwardly from each corner of the frame. The latch members include a horizontal section which consists of an obliquely extending portion, indicated by reference numeral 48, and, at a predetermined distance from the frame, a "straight" portion, i.e., extending forwardly and accordingly, parallel to side members 36. These straight portions are indicated by reference numeral 50. A first tab 52, attached to the outer edge of oblique portion projects outwardly away therefrom in a direction parallel to cross members 42; i.e., a direction normal or perpendicular to straight portions 50.

The latch member further includes a depending portion 54 at the outwardly or forward ends of the straight portions 50. The free ends of portions 54 are turned inwardly; i.e., back towards the frame, to provide lips 56.

A second tab, indicated by reference numeral 58, is attached to the outer edge of each depending portion 54 near lip 56. This tab also projects laterally in the same direction as first tab 52. Accordingly, each latch member has a set of two tabs, both projecting away in the same direction and with the second tab displaced vertically downwardly from the first.

Each latch is resilient so that it has some flexibility. To provide this resiliency, cover 10 is preferrably made from a spring metal such as steel. Release mechanism 34 is also made from such material.

Latch members 46 include an obliquely extending portion 48 only to position depending portion 54 and lips 56 on the outer edges of the connector housing to avoid interferring with the contact elements in the housing. In another type housing, the latch members could as easily extend straight forward.

Release mechanism 34 is Y-shaped with the leg being plate 60 which is of substantial size. As FIG. 1 shows, plate 60 covers nearly half of cover 10. The rearward free end 62 is curved down.

Arms 64 extend forwardly from the plate, the attachment being adjacent the sides thereof. Because the arms preferrably overlie latch members 46 on cover 10, they include a horizontal section which consists of an oblique portion 66 and straight portion 68.

Flap 70 extends downwardly from the outer side of straight portion 68. As shown in FIG. 5, the flaps are positioned at about twenty degrees from the vertical.

Figure 2:
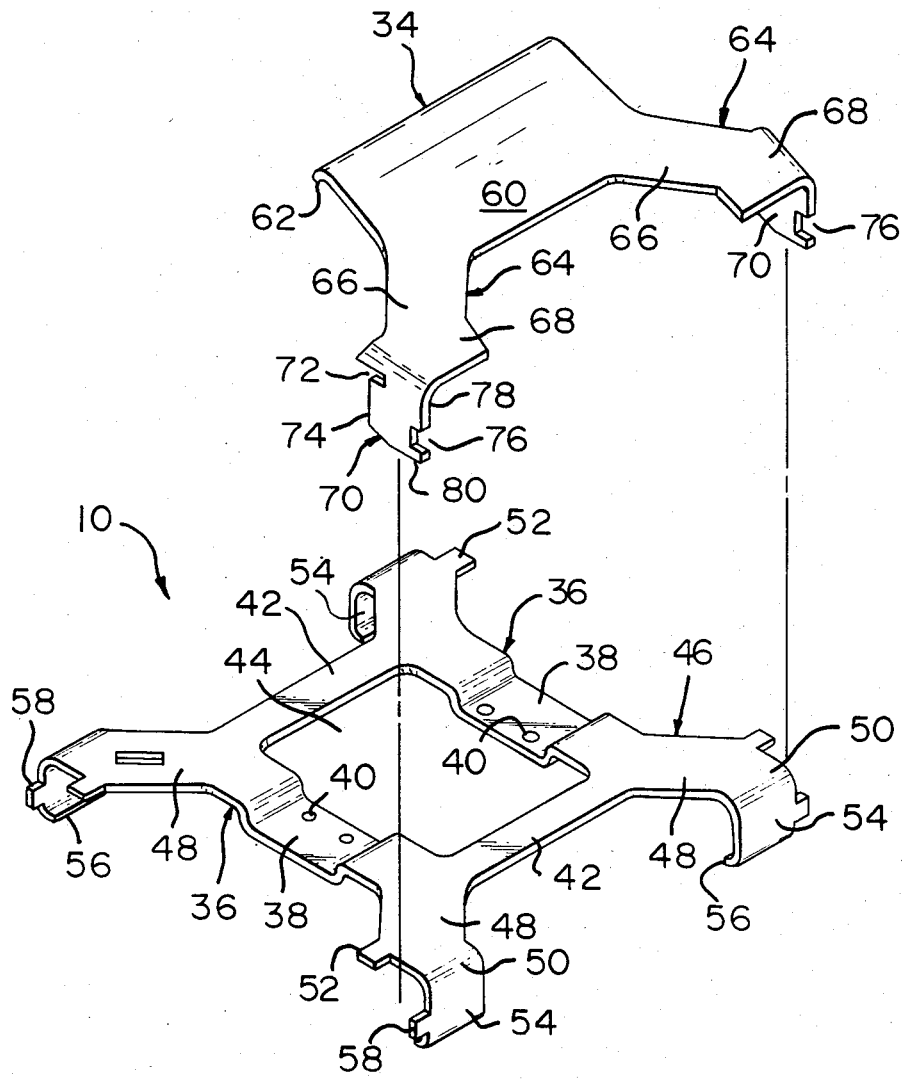
FIG. 2 is an exploded, isometric view of the release mechanism of FIG. 1 disassembled from the cover.

Returning to FIG. 2, two notches are provided in the vertical edges of the flaps. First notch 72 is located in the rearward facing edge 74 near the top; i.e., near the attachment to the horizontal section, and second notch 76 located in the forward facing edge 78 near lower end 80.

The dimensions and spacing of arms 64 coincide with latch members 46 so that upon the release mechanism being assembled to cover 10, arms 64 overlay the latch members and flaps 70 extend down immediately alongside the outer edges of portions 50 and 54. First tabs 52 are received into first notches 72 and second tabs 58 are received into second notches 76. With the tabs so positioned, the release mechanism is securely attached to the cover and can be removed therefrom with great difficulty.

As both FIGS. 1 and 3-5 show, plate 60 extends rearwardly and upwardly over the base.

Figure 3:
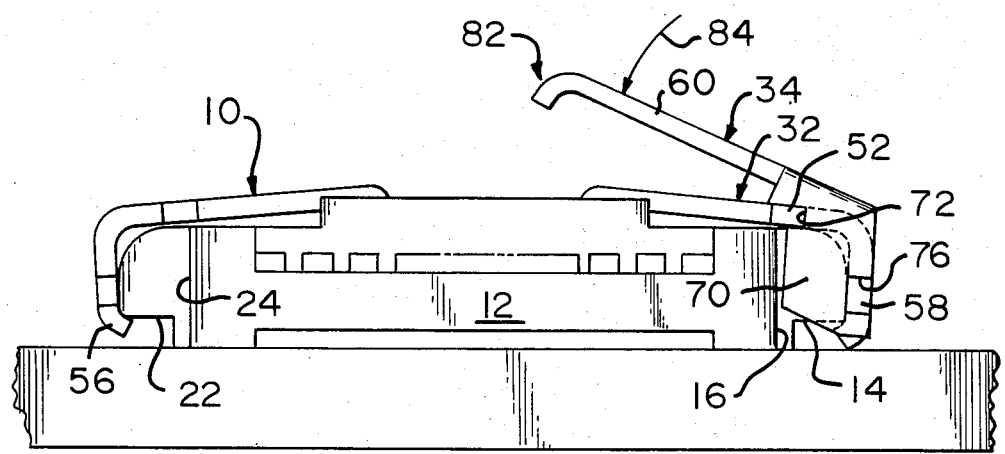
FIGS. 3, 4 and 5 illustrate the positioning of the cover and release mechanism of FIG. 1 on the connector of FIG. 1 and the release of the cover therefrom by means of the release mechanism.

The assembled cover 10 and release mechanism 34 is extremely easy to use. The assembly, indicated by reference numeral 82, snaps onto a suitable connector; e.g., connector 12, by catching all four lips 56 (on depending portions 54) in under downwardly facing shoulders 14 and 22 (on the corners of the connector). FIG. 3 is a side view showing assembly 82 mounted on connector 12.

Releasing the cover requires downward pressure against plate 60 as arrow 84 in FIG. 3 indicates.

Figure 4:
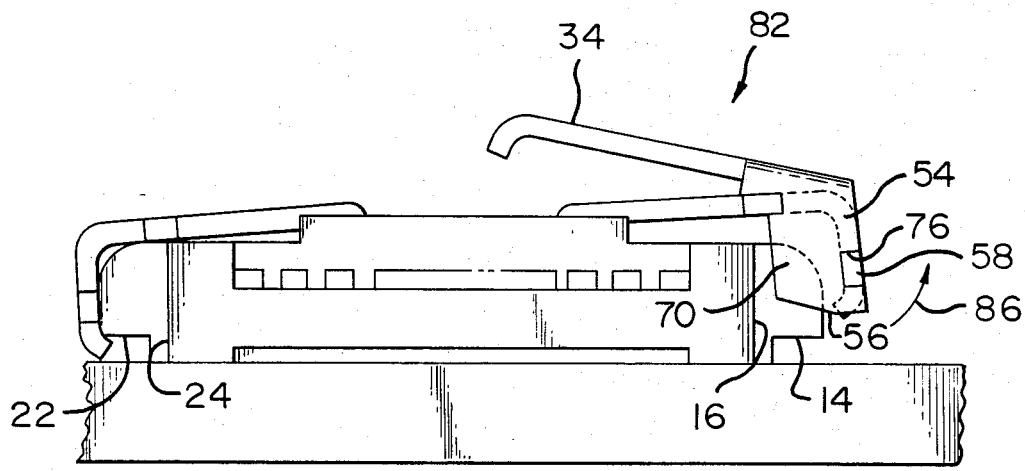

Referring to FIG. 4, the aforementioned downward pressure on plate 60 moves or pivots flaps 70 upwardly as indicated by arrow 86. The pivot points are first tabs 52. The depending portions 54 are pulled along by tabs 58 being in notches 76. Lips 56 are accordingly pulled out from under shoulders 14. Cover 10 is then completely removed by simply disengaging from the retaining means on opposite side 20 as shown in FIG. 5.

Cover 10 is shown with one end being identical to the other end. Accordingly, release mechanism 34 may be mounted on either end.

As noted above, cover 10 may be very easily modified to be used on connectors having retaining means on opposite side 20 differing from the downwardly facing shoulders. One such modification might be to use the U-shaped hinge loops on the connector as disclosed in U.S. Pat. No. 4,278,311 and corresponding openings on one end of the cover through which the loops pass. Depending portions 54 on that end would be removed. The advantage of this arrangement is that the cover cannot become lost from the connector.

The release mechanism has been described in accordance with the preferred embodiment. It must be understood, however, that the mechanism could be modified while still retaining the essence of the invention. For example, the release mechanism could have a shape other than a Y. Likewise, the shape of cover 10 could be changed provided the structural features required for the use of release mechanism 34 are retained. Further, the tabs 52 and 58 could be round rather than flat and the notches modified accordingly.

We claim:

1. A release mechanism for releasing a cover on a connector housing having corners, said cover being of the type having arms extending to the housing corners, latches attached to the arms which include a depending member with an inwardly projecting lip at a free end for being latched under shoulders on the housing and laterally projecting tabs including a first tab being on each arm near the latch and a second tab being on each depending member near the lip; said release mechanism comprising:
    a. a plate;
    b. a pair of arms attached to and extending from each of two adjacent corners of the plate;
    c. a flap attached to and depending from the side of each arm and having a first notch positioned near the arm to which the flap is attached and opening towards the plate and a second notch opening in the opposite direction and positioned near a free end of the flap;
said release mechanism being attached to the cover by each flap extending along a side of a depending member with the first tab received in the first notch and the second tab received in the second notch and the plate overlying some of the cover, said release mechanism operable by pushing down on the plate to rotate the flaps up and out which draws the lips out from beneath the shoulders via the second tabs being positioned in the second notches.

2. A release mechanism according to claim 1 wherein the flaps depend obliquely from and relative to the arms to which they are attached.

3. A cover having a release mechanism to release it from attachment to a connector of the type having at least two downwardly facing shoulders located on a sidewall, said cover comprising:
    a. a frame positionable on top of the connector;
    b. arms attached to the frame and extending towards at least two adjacent corners of the connector;
    c. latches attached to the arms and each having a depending portion with a turned-in lip at a free end thereof for being received in under a downwardly facing shoulder on the connector sidewall to latch the cover thereto;
    d. a first tab projecting laterally from a side of the arm near the latch and a second tab projecting laterally from a side of the depending portion near the lip; and
    e. a release mechanism comprising a plate with an arm attached to and extending from each of two adjacent corners and a flap attached to and depending from a side of each arm adjacent a free end thereof, each flap having a first notch on one edge near the arm and a second notch on an opposite edge near a lower end of the flap, said release mechanism being attached to the cover with the plate extending over and above the frame and the flaps extending down along side the depending portions of the latches such that the first tabs are received in the first notches and the second tabs are received in the second notches so that upon pushing down on the plate, the flaps pivot about the first tabs to cause the lower ends of the flaps to rotate outwardly from the connector and pulling with them, by reason of the second tabs being caught in the second notches, the lips from beneath the downwardly facing shoulders.

4. A cover according to claim 3 wherein the flaps extend obliquely downwardly.

* * * * *